(12) United States Patent
Disney

(10) Patent No.: US 6,424,007 B1
(45) Date of Patent: Jul. 23, 2002

(54) HIGH-VOLTAGE TRANSISTOR WITH BURIED CONDUCTION LAYER

(75) Inventor: Donald Ray Disney, Cupertino, CA (US)

(73) Assignee: Power Integrations, Inc., San Jose, CA (US)

(*) Notice: Subject to any disclaimer, the term of this patent is extended or adjusted under 35 U.S.C. 154(b) by 0 days.

(21) Appl. No.: 09/769,649

(22) Filed: Jan. 24, 2001

(51) Int. Cl.[7] .................... H01L 31/062; H01L 29/784
(52) U.S. Cl. .................... 257/342; 257/342; 257/104
(58) Field of Search .................... 257/20, 24, 27, 257/66, 192, 213, 147, 287, 346, 349, 341–343, 345, 376, 348–550; 438/140, 342, 454, 301–306

(56) References Cited

U.S. PATENT DOCUMENTS 5,386,136 A * 1/1995 Williams et al. ............ 257/104
6,168,983 B1 * 1/2001 Rumennik et al. .......... 438/188
6,207,994 B1 * 3/2001 Rumennik et al. .......... 257/342

FOREIGN PATENT DOCUMENTS

JP 06224426 * 8/1994 ......... H01L/29/784

* cited by examiner

Primary Examiner—David Nelms
Assistant Examiner—Long Tran
(74) Attorney, Agent, or Firm—Burgess & Bereznak, LLP

(57) ABSTRACT

A lateral, high-voltage, FET having a low on-resistance and a buried conduction layer comprises a P-type buried layer region within an N-well formed in a P-type substrate. The P-type buried layer region is connected to a drain electrode by a first P-type drain diffusion region that is disposed in the N-well region. The P-type buried layer region is also connected to a second P-type drain diffusion region that extends down from the surface at one end of the PMOS gate region. A P-type source diffusion region, which connects to the source electrode, defines the other end of the gate region.

22 Claims, 3 Drawing Sheets

HIGH-VOLTAGE TRANSISTOR WITH BURIED CONDUCTION LAYER

RELATED APPLICATION

This application is related to U.S. patent application Ser. No. 09/245,029, filed Feb. 5, 1999, of Rumennik et al., which application is assigned to the assignee of the present application and is herein incorporated by reference.

FIELD OF THE INVENTION

The present invention relates to semiconductor devices. More specifically, the present invention relates to high voltage field-effect transistor structures fabricated in silicon substrates.

BACKGROUND OF THE INVENTION

Lateral, high-voltage, field-effect transistors (HVFETs) have been fabricated using an insulated gate field-effect transistor (IGFET) placed in series with a high-voltage junction field-effect transistor (JFET). The IGFET is used to control the "on" state current in the device and the JFET is used to support high-voltage in the "off" state. This HVFET structure can be switched at high voltages, has a low on-state resistance, and has insulated-gate control. In addition, it may advantageously be fabricated near low voltage logic transistors on a single integrated circuit chip.

Lateral HVFETs are commonly fabricated in accordance with the Reduced Surface Field (RESURF) principle. The RESURF principle, however, mandates that the charge in the extended drain region, which serves as the channel of a lateral JFET, be carefully controlled to obtain high breakdown voltage. To keep the maximum electric field below the critical field at which avalanche breakdown occurs the amount of charge in the JFET channel is typically limited to a maximum of about $1 \times 10^{12}$ cm$^{-2}$. When the HVFET is in the "on" state, the resistance of the JFET channel constitutes a large portion of the on-state resistance of the HVFET. Therefore, the limitation on the maximum charge in the JFET channel also sets the minimum specific on-resistance of the device.

A HVFET having an extended drain region with a top layer of a conductivity type opposite that of the extended drain region is disclosed in U.S. Pat. No. 4,811,075. The '075 patent teaches that the top layer nearly doubles the charge in the conducting layer, with a commensurate reduction in device on-resistance. This top layer also helps to deplete the JFET conduction region when the extended drain is supporting a high voltage.

Further extending this concept, U.S. Pat. No. 5,411,901 teaches utilizing the opposite conductivity type top layer as the conducting portion of the JFET in a complementary high-voltage transistor. One drawback, however, is that construction of this complementary device requires additional processing steps to achieve high-voltage capability. Additionally, the on-resistance of the complementary device is limited by the charge requirement for the top region (e.g., about $1 \times 10^{12}$ cm$^{-2}$). Another difficulty is that the top layer is often formed prior to oxidation of the silicon surface, which introduces additional process variation.

To further increase the total charge in the conducting region of the JFET and reduce on-resistance, U.S. Pat. No. 5,313,082 teaches a HVFET structure in which two JFET channels are arranged in parallel. A triple diffusion process is disclosed, in which three separate implant and diffusion steps are required to form a HVFET having an N-type conducting top layer, a P-type middle layer, and an N-type conducting bottom layer. The multiple layers of alternating conductivity types are fabricated by implanting, and then diffusing, dopants into the semiconductor substrate. The '082 patent also describes a complementary high-voltage transistor (i.e., a P-channel device) that is formed by adding an additional layer to the three-layer extended drift region.

One shortcoming of this prior art approach is that each successive layer is required to have a surface concentration that is higher than the preceding layer, in order to fully compensate and change the conductivity type of the corresponding region. Diffusion of dopants from the surface makes it very difficult to maintain adequate charge balance among the layers. In addition, the heavily doped P-N junction between the buried layer and drain diffusion region degrades the breakdown voltage of the device. The concentrations also tend to degrade the mobility of free carriers in each layer, thereby compromising the on-resistance of the HVFET. The additional layer required for making the complementary device also complicates the manufacturing process.

A p-channel MOS device design that is compatible with a generic process for manufacturing complementary CMOS devices is disclosed in U.S. Pat. No. 5,894,154.

BRIEF DESCRIPTION OF THE DRAWINGS

The present invention is illustrated by way of example, and not limitation, in the figures of the accompanying drawings, wherein.

DETAILED DESCRIPTION

A high-voltage field-effect transistor is described. The HVFET has a low specific on-state resistance, and can be easily integrated with a complementary lateral HVFET on the same chip along with low voltage logic devices. In the following description, numerous specific details are set forth, such as material types, doping levels, structural features, processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

Figure 1:
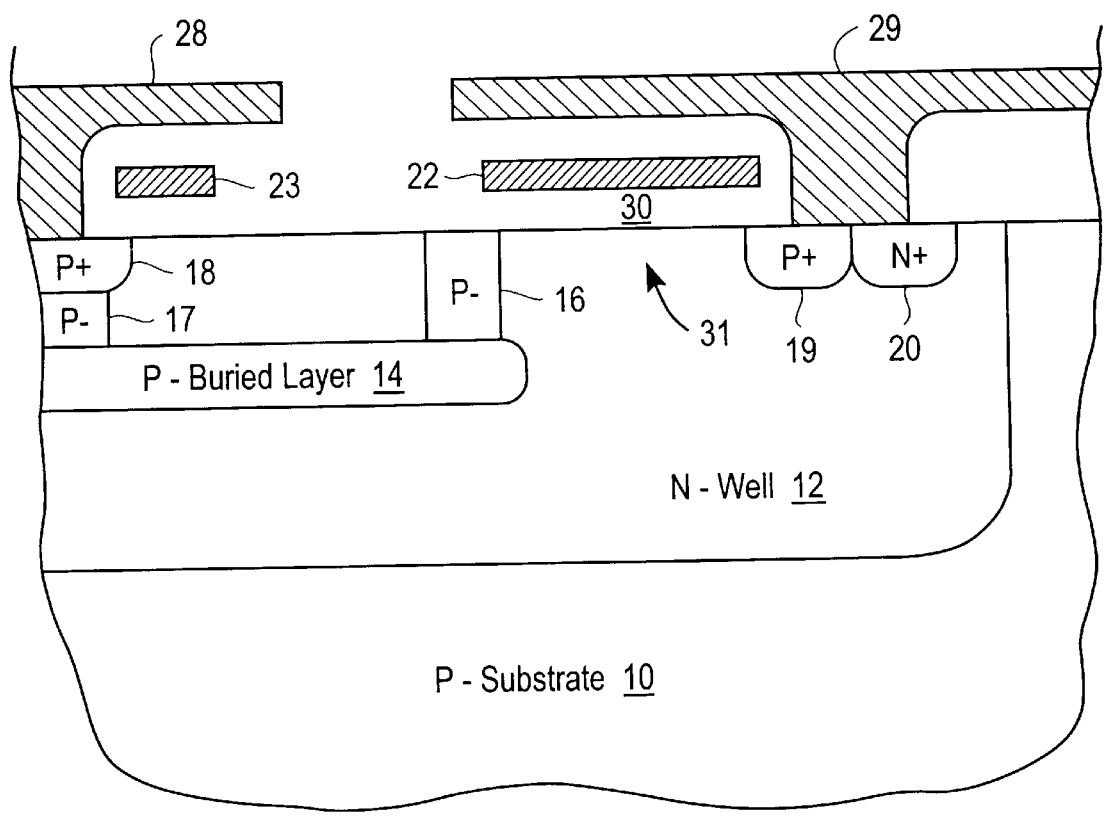
FIG. 1 is a cross-sectional side view of one embodiment of a high-voltage, field-effect transistor (HVFET) device structure in accordance with the present invention.

FIG. 1 is a cross-sectional side view of a p-channel HVFET device structure in accordance with one embodiment of the present invention. (It should also be understood that the elements in the figures are representational, and are not drawn to scale in the interest of clarity.) An N-channel transistor may be realized by utilizing the opposite conductivity types for all of the illustrated diffusion regions. The device of FIG. 1 includes an insulated-gate, field-effect transistor (IGFET) having a gate 22 (comprised, for example, of polysilicon), an gate insulating layer 30, comprised of silicon dioxide or another appropriate dielectric insulating material, and an underlying N-type well region 12 disposed in a lightly-doped P-type substrate region 10. The area of n-type well region 12 directly beneath gate 22 comprises the IGFET channel region 31 of the transistor. In this embodiment, the gate region is a metal-oxide semiconductor (MOS), and the IGFET is a PMOS transistor.

Channel region 31 is defined at one end by P+ source diffusion region 19 and at the other end by P-type diffusion region 16, which extends down from the substrate surface of N-well 12. A lateral high-voltage p-channel FET is formed by the series connection of the PMOS device and a P-type JFET transistor formed by high-energy implantation of a P-type dopant (e.g., boron) into N-well region 12. This high-energy implantation forms P-type buried layer 14, which is connected to and p-type diffusion region 16. Buried layer 14 comprises the conducting portion of the extended drain of the P-type JFET device. The charge in P-type buried region 14 is approximately $2 \times 10^{12}$ cm$^{-2}$ in this embodiment, resulting in an on-resistance that is about 50% lower that traditional devices.

Practitioners in the art will appreciate that the doping in P-type diffusion region 16 is chosen so that this region can be fully depleted at a relatively low voltage (<100V) in the off state. This insures that region 16 does not interfere with the ability of the transistor to support high voltage (~700V) in the off state.

A source electrode 29 provides an electrical connection to P+ source diffusion region 19. Similarly, a drain electrode 28 connects to a P+ drain diffusion region 18. Drain diffusion region 18 and source diffusion region 19 may be formed using the same implant steps. Electrical connection between drain diffusion region 18 and buried layer 14 is established via P-type diffusion region 17. It is understood that region 17 may be formed simultaneous with P-type diffusion region 16 using the same processing steps. Alternatively, P+ drain diffusion region 18 may be formed to extend vertically from the substrate surface down to P-type buried layer 14.

Respective source and drain electrodes 29 and 28 may comprise a number of widely used metals or metal alloys. Note that source electrode 29 is shown extending over, and insulated from, gate 22 where it functions as a field plate. Similarly, drain electrode 28 extends over polysilicon field plate member 23, disposed above and adjacent to drain diffusion region 18. Field plating acts to reduce the surface electric field and increase the effective radius for depletion of the substrate, thereby increasing the breakdown voltage of the transistor.

In the embodiment of FIG. 1, a N+ diffusion region 20 is disposed adjacent to P+ source diffusion region 19. Diffusion region 20 provides good electrical connection to N-well region 12 and thus reduces susceptibility of the device to parasitic bipolar effects.

When the P-channel HVFET of FIG. 1 is in the on-state, current flows from the source diffusion region 19 through the IGFET channel region 31 and then through P-type regions 16, 14, and 17 to P+ drain diffusion region 18. As discussed above, the charge in P-type buried region 14 is approximately twice as high than that of a conventional P-channel device. Thus, the resistance of the extended drain region is reduced to about ½ that of a conventional device.

In the off state, P-diffusion region 16, P-type buried layer region 14, and N-well region 12 are mutually depleted of free carriers.

An important advantage of the device structure shown in FIG. 1 is that it can be constructed using the same process used to fabricate a complementary, high-voltage, N-channel FET. For instance, such a process is set forth in FIGS. 11a–11i and the associated description of the incorporated Rumennik et al. patent application. Significantly, no additional processing complexity is introduced since the same masking layers may be used for both devices, other than the addition of P-type region 16.

In accordance with the aforementioned process for fabricating an N-channel HVFET, building a complementary device on the same silicon substrate can be accomplished by segregating the respective N-well regions associated with the P-channel and N-channel devices. The masking layer used to form P-type buried layer region 14 of the P-channel device can be used to simultaneously form the buried layer region of the N-channel device structure. In the N-channel device, this P-type buried layer divides the single conductive N-well into parallel conductive drift regions of the JFET transistor. Added in parallel, each conductive region reduces the on-resistance of the HVFET structure.

Figure 3:
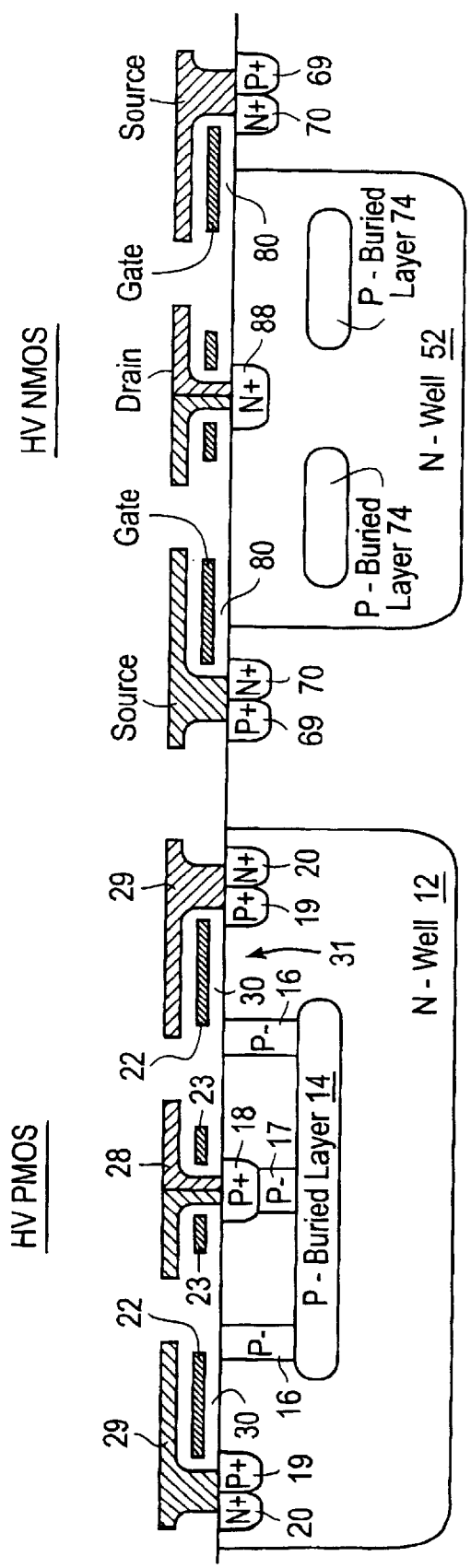
FIG. 3 is a cross-sectional side view of complementary HVFETs fabricated on the same substrate in accordance with the present invention.

By way of example, FIG. 3 illustrates high-voltage PMOS and NMOS transistors fabricated adjacent to one another on the same P-type substrate 10. Note that the same processing steps used to form N-well 12 of the PMOS device may also be used to fabricate N-Well 52 of the NMOS device. Similarly, buried layer 14 of the PMOS device and buried layer 74 of the NMOS device may be formed using the same steps. Other regions of the PMOS and NMOS devices that can be formed with the same processing steps include P+ regions 19 and 69, N+ regions 20 and 70, and gate oxide regions 30 and 80, respectively.

P-type diffusion region 16 of FIG. 1, for example, may be formed either before or after the implantation step that forms the P-type buried layer regions of the N-channel and P-channel devices. By way of example, diffusion region 16 may be formed by implantation of boron into the substrate following formation of N-well 12. If the process optionally includes steps for forming a field oxide layer, P-type diffusion region 16 may be formed in N-well 12 either prior to field oxide growth, or afterward, utilizing conventional processing techniques.

Figure 2:
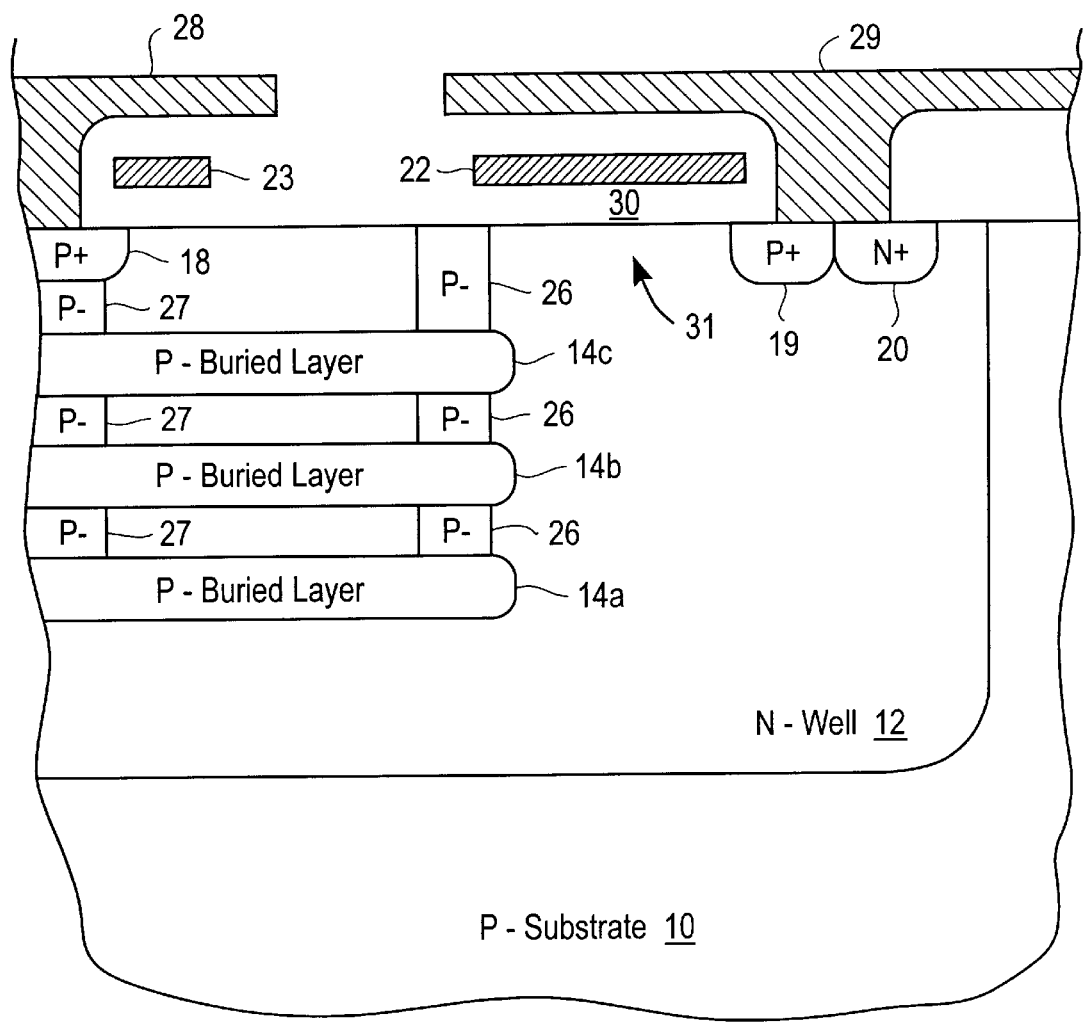
FIG. 2 is a cross-sectional side view of another embodiment of a HVFET fabricated in accordance with the present invention.

FIG. 2 illustrates an alternative embodiment of the present invention, which comprises a plurality of vertically stacked P-type buried layer regions 14a–14c disposed in N-well region 12. In a typical processing sequence, a single implant mask is used to define all of the buried layers. High-energy implantation is then used to form buried layer region 14a, 14b, and 14c. The device structure of FIG. 2 includes a P-type diffusion region 26, which defines one end of channel 31. Diffusion region 26 extends down from the substrate surface to electrically connect with each of buried layer regions 14a–14c. Similarly, P-type diffusion region 27 extends vertically down from P+ drain diffusion region 18 to connect with each of buried layer regions 14a–14c. Instead of forming a separate P-type region 27, the connection to each of buried layer regions 14 beneath drain diffusion region 18 may be achieved by simply extending P+ drain diffusion region 18 vertically down from the substrate surface to a depth sufficient to connect with buried layer regions 14a–14c.

Thus, the spaced-apart P-type buried layer regions 14 in the HVFET of FIG. 2 provide parallel conduction paths. By controlling the charge in each of the buried layer regions 14 the ability of the P-channel device to support high voltage in not compromised. Moreover, in accordance with the above teachings, each additional conducting layer contributes an additional $2 \times 10^{12}$ cm$^{-2}$ of charge to further lower the on-resistance of the device.

I claim:

1. A high-voltage field-effect transistor (HVFET) comprising:
   a substrate of a first conductivity type;
   a well region of a second conductivity type, opposite to the first conductivity type, disposed in the substrate;
   a source diffusion region of the first conductivity type disposed in the N-well region;
   a first drain diffusion region of the first conductivity type disposed in the N-well region spaced-apart from the source diffusion region, a channel region being defined in the well region between the source diffusion region and the first drain diffusion region;
   a second drain diffusion region of the first conductivity type disposed in the well region spaced-apart from the first drain diffusion region;
   a buried layer region of the first conductivity type disposed within the well region, extending laterally from beneath the first drain diffusion region to beneath the second drain diffusion region, the buried layer region being connected to both the first and second P-type drain diffusion regions such that current flows laterally through the buried layer region when the HVFET is in an on-state; and
   an insulated gate formed over the channel region.

2. The HVFET according to claim 1 further comprising:
   a source electrode connected to the source diffusion region; and
   a drain electrode connected to the second drain diffusion region.

3. The HVFET according to claim 2 further comprising:
   a diffusion region of the second conductivity type disposed in the well region adjacent the source diffusion region, the diffusion region being connected to the source electrode.

4. The HVFET according to claim 2 wherein the first conductivity type is P-type and the second conductivity type is N-type, and the second drain diffusion region comprises:
   a P+ diffusion region connected to the drain electrode; and
   an additional P-type diffusion region that extends from the P+ diffusion region to the buried layer region.

5. The HVFET according to claim 2 wherein the source and drain electrodes each comprise laterally extended portions that function as field plates.

6. The HVFET according to claim 5 further comprising a drain field plate member disposed adjacent to and insulated from the second drain diffusion region, the drain field plate member also being disposed beneath and insulated from the laterally extended portion of the drain electrode.

7. The HVFET according to claim 1 wherein the buried layer region comprises a plurality of buried layers.

8. The HVFET according to claim 7 wherein the first drain diffusion region extends vertically in the well region to connect to each of the plurality of buried layers.

9. The HVFET according to claim 8 wherein the second drain diffusion region extends vertically in the well region to connect to each of the plurality of buried layers.

10. The HVFET according to claim 1 wherein the first drain diffusion region has a first surface that adjoins a surface of the substrate.

11. The HVFET according to claim 1 wherein the first conductivity type is N-type and the second conductivity type is P-type.

12. The HVFET according to claim 1 wherein the first drain diffusion region is depleted at a relatively low voltage.

13. A high-voltage field-effect transistor (HVFET) comprising:
   a substrate of a first conductivity type;
   a well region of a second conductivity type opposite to the first conductivity type, the well region being disposed in the substrate;
   a source diffusion region of the first conductivity type disposed in the well region;
   a first drain diffusion region of the first conductivity type disposed in the well region laterally spaced-apart from the source diffusion region;
   a second drain diffusion region of the first conductivity type disposed in the well between the first drain diffusion region and the source diffusion region, a channel region being defined in the well region between the source diffusion region and the second drain diffusion region;
   a plurality of parallel, spaced-apart buried layers of the first conductivity type disposed within the well region, the buried layers extending laterally from beneath the first drain diffusion region to beneath the second drain diffusion region, the first and second drain diffusion regions extending vertically in the well region to connect to each of the buried layers such that current flows laterally through each of the buried layers when the HVFET is in an on-state; and
   an insulated gate formed over the channel region.

14. The HVFET according to claim 13 further comprising:
   a source electrode connected to the source diffusion region; and
   a drain electrode connected to the first drain diffusion region.

15. The HVFET according to claim 14 further comprising:
   a diffusion region of the second conductivity type disposed in the well region adjacent the source diffusion region, the diffusion region being connected to the source electrode.

16. The HVFET according to claim 14 the first conductivity type is P-type and the second conductivity type is N-type, and the first drain diffusion region comprises:
   a P+ diffusion region connected to the drain electrode; and
   an additional P-type diffusion region that vertically extends down from the P+ diffusion region to each of the buried layers.

17. The HVFET according to claim 14 wherein the source and drain electrodes each comprise laterally extended portions that function as field plates.

18. The HVFET according to claim 17 further comprising a drain field plate member disposed adjacent to and insulated from the first drain diffusion region, the drain field plate member also being disposed beneath and insulated from the laterally extended portion of the drain electrode.

19. The HVFET according to claim 13 wherein each of the buried layers are fully depleted at a relatively low voltage when the HVFET is in an off-state.

20. The HVFET according to claim 14 wherein the first drain diffusion region comprises a diffusion region that contacts the drain electrode and extends vertically down in the well region to connect with each of the of buried layers.

21. The HVFET according to claim 13 wherein the second drain diffusion region has a first surface that adjoins a surface of the substrate.

22. The HVFET according to claim 13 wherein the first conductivity type is N-type and the second conductivity type is P-type.

* * * * *

UNITED STATES PATENT AND TRADEMARK OFFICE
CERTIFICATE OF CORRECTION

PATENT NO.    : 6,424,007 B1
DATED         : July 24, 2002
INVENTOR(S)   : Disney, D.

It is certified that error appears in the above-identified patent and that said Letters Patent is hereby corrected as shown below:

Column 5,
Lines 8 and 11, each occurrence of "N-well" should read -- well --.
Line 22, "P-type" should be deleted.

Signed and Sealed this

Twelfth Day of November, 2002

Attest:

JAMES E. ROGAN
Attesting Officer    Director of the United States Patent and Trademark Office